(12) United States Patent  
Kreuzer (10) Patent No.: US 6,360,012 B1  
(45) Date of Patent: Mar. 19, 2002

(54) IN SITU PROJECTION OPTIC METROLOGY METHOD AND APPARATUS

(75) Inventor: Justin L. Kreuzer, Trumbull, CT (US)

(73) Assignee: SVG Lithography Systems, Inc., Wilton, CT (US)

( * ) Notice: Subject to any disclaimer, the term of this patent is extended or adjusted under 35 U.S.C. 154(b) by 0 days.

(21) Appl. No.: 09/344,664

(22) Filed: Jun. 25, 1999

(51) Int. Cl.$^7$ .................. G06K 9/76; H04N 17/00; H04N 1/00; G01J 3/40; G02F 1/00

(52) U.S. Cl. .............. 382/211; 382/140; 382/141; 382/145; 382/190; 382/207; 382/286; 348/180; 356/305; 356/450; 356/456; 356/458; 356/512; 356/521; 359/237; 359/248; 358/406

(58) Field of Search .................. 382/141, 145, 382/151, 152, 181, 190, 207, 211, 286, 132, 140; 348/180; 358/406; 359/237, 244, 248

(56) References Cited

U.S. PATENT DOCUMENTS

| | | | |
|---|---|---|---|
| 4,670,646 A | * 6/1987 | Spivey | 250/201.9 |
| 4,707,137 A | * 11/1987 | Lee | 356/520 |
| 5,680,588 A | * 10/1997 | Gortych et al. | 716/19 |
| 5,978,085 A | * 11/1999 | Smith et al. | 356/521 |
| 6,118,535 A | * 9/2000 | Goldberg et al. | 356/521 |

* cited by examiner

Primary Examiner—Leo Boudreau  
Assistant Examiner—Daniel G. Mariam (57) ABSTRACT

Wavefront information for an optical system is calculated based on the intensity of an image of a plurality of gratings having different periods and orientations taken from at least two different planes a predetermined distance apart. The image of a plurality of gratings having different spatial frequencies or periods and orientations, the location of which are precisely known, are imaged in a nominal focal plane of the optical system, and, preferably, in two additional planes displaced a predetermined distance from the nominal focal plane. The phase shift, if any, from a fundamental frequency of the image intensity, is determined based on the known location of the grating and the grating image intensity. The grating image intensity is detected and measured in a first detection plane in a nominal focal plane and in a second detection plane a predetermined distance from the nominal focal plane. From these measurements wavefront information is calculated. By utilizing a plurality of different gratings, the wavefront at different spatial locations in the optical system may be mapped, providing information relating to image quality. The present invention provides wavefront information, which is directly related to image quality, relatively easily and without having to remove the optical system from the device, such as a photolithographic device used in semiconductor manufacturing. The present invention is particularly applicable to optical systems designed for UV illumination, which tends to degrade or modify optics over time. More consistent, better quality imaging is obtained with reduced down time.

26 Claims, 5 Drawing Sheets

IN SITU PROJECTION OPTIC METROLOGY METHOD AND APPARATUS

GOVERNMENT INTEREST

The United States Government may have certain rights in the present invention pursuant to Contract No. N00014-96-C-0291 awarded by the Naval Air Command.

FIELD OF THE INVENTION

The present invention relates in general to the measurement of a wavefront in an optical system, and more particularly to the measurement of the wavefront in an optical system used in a photolithographic device without the need for removing the optical system, performing any analysis at a different location, and with little, if any, disruption in production associated with the photolithographic device.

BACKGROUND OF THE INVENTION

Optical systems are used in many devices. In particular, optical systems are relied upon greatly in the manufacture of semiconductor devices. In one phase in the manufacturing process of semiconductor devices, photolithography is used. These photolithographic techniques are used to project the image of a reticle containing a circuit pattern thereon onto a photosensitive substrate through a projection optic. The projection optic is typically relatively complex and susceptible to changes in system performance as a result of numerous factors, such as temperature, humidity, age, and use. As more demands are placed on the projection optics in a photolithographic device, especially when the projection optic is designed to work in the ultraviolet regions of wavelength, the projection optic is susceptible to changes that may degrade performance. Due to the high degree of image quality required in photolithographic devices used to manufacture semiconductors, various measurements must be routinely taken in an effort to assure that any change in the projection optic will not effect the quality of the resulting semiconductor product. This is particularly important in view of the potentially wasted cost in time and effort of subsequent processing after the formation of an image in the photolithographic step in manufacturing of a semiconductor device. Therefore, it is essential to determine as quickly as possible when the projection optic has changed or degraded to an extent that may effect product quality. Basic performance of the projection optic is predictable from a measurement of the wavefront of the electromagnetic radiation used to project the image of a pattern onto a photosensitive substrate. Accordingly, knowledge of the wavefront is critically important. Measurement of the wavefront of the projection optic is routinely done prior to installation into a production photolithographic device or tool. These measurements are usually performed with the aid of an interferometer. However, after the projection optic is installed within the production tool or device, it is often difficult to make any further measurements of the wavefront of light or electromagnetic radiation transmitted through the projection optic. Generally, the projection optic must be removed in order to perform the required measurements, or additional measuring devices must be installed, such as an interferometer, into the photolithographic tool. Also, an image may be printed or electronically recorded and analyzed using conventional techniques in order to obtain information needed to determine system performance. However, due to the increasing need to maintain system performance with little down time and as little disruption in production as possible, there is a need to assess system performance in as near real time as possible so as to assure that performance is maintained at a high level. Therefore, there is a need to improve upon the known techniques for measuring and monitoring system performance of projection optics without the need for removal of the projection optics or installation of additional complex equipment, such as interferometers, in production photolithographic tools, or the analyzing of printed or electronically recorded images utilizing conventional techniques.

SUMMARY OF THE INVENTION

The present invention is directed to an apparatus and method for measuring and monitoring the performance of the projection optic in a photolithographic device comprising a plurality of gratings having different pitches and rotations formed or placed on a reticle in predetermined sections, in a known location, and imaged through the projection optic to be measured. Any shift in position of the grating image is detected and determined, as well as the modulation of the grating image in at least two planes with the data being used to calculate wavefront information for the projection optic.

Accordingly, it is an object of the present invention to provide wavefront information without the need for removing the projection optic from the photolithographic tool or device.

It is another object of the present invention to make metrology measurements of wavefront information quickly and in near real time.

It is an advantage of the present invention that better and more timely process control is obtained.

It is yet another advantage of the present invention that there is less interruption of production with reduced down time, resulting in more efficient operation.

It is a feature of the present invention that a plurality of gratings having different pitch and orientation are used.

It is another feature of the present invention that the intensity of the images of each of the plurality of gratings is obtained in at least two planes.

These and other objects, advantages, and features will become readily apparent in view of the following detailed description.

BRIEF DESCRIPTION OF THE DRAWINGS

FIG. 1 schematically illustrates the present invention.

DETAILED DESCRIPTION OF THE PREFERRED EMBODIMENTS

Figure 1:
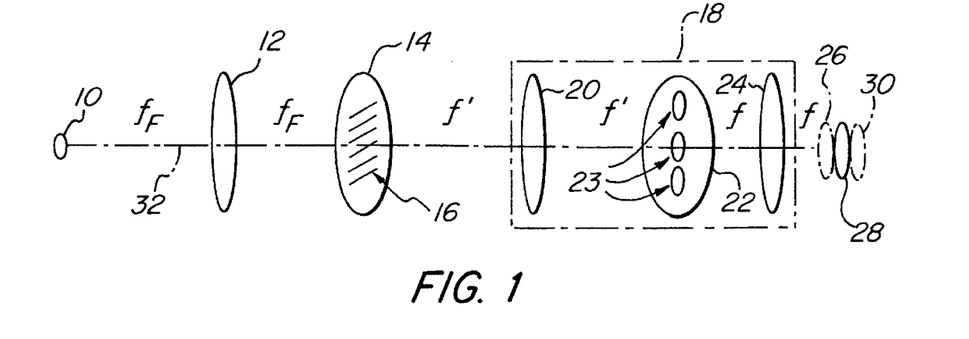

FIG. 1 schematically illustrates the operation of the present invention. This illustration and the related description describe the behavior for small angle diffraction. Although the ray paths and optics are more complicated, the fundamental behavior for larger angle diffraction is similar. A source pupil is positioned at a focal distance $f_F$ from a field lens 12. A reticle 14 having gratings 16 thereon is positioned a focal distance $f_F$ from the field lens 12. A focal distance f' from the reticle 14 is positioned a reticle lens 20. A pupil 22 contains at least three diffraction orders 23 thereon produced by the source and the grating and is located a focal distance f' from the reticle lens 20. A wafer lens 24 is positioned a focal distance f from the pupil 22. Reticle lens 20, pupil 22, and wafer lens 24 form the projection optic 18. The projection optic 18 is used to image the gratings 16 on reticle 14 onto a nominal focal plane 28 located a distance f from the wafer lens 24. On either side of nominal focal plane 28 are first plane 26 and second plane 30. The first plane 26 is located a predetermined distance from the nominal focal plane 28 and the second plane 30 is located another predetermined distance from the nominal focal plane 28. Typically, these planes are located at approximately equal distances on either side of plane 28. Typically, these planes are the planes closest to plane 28 where the grating fundamental frequency modulation is either significantly reduced or a minimum. All of the optical elements 12, 14, 20, 22, and 24 are aligned on a common optical axis 32. Planes 26, 28, and 30 are substantially normal to the optical axis 32.

Figure 2:
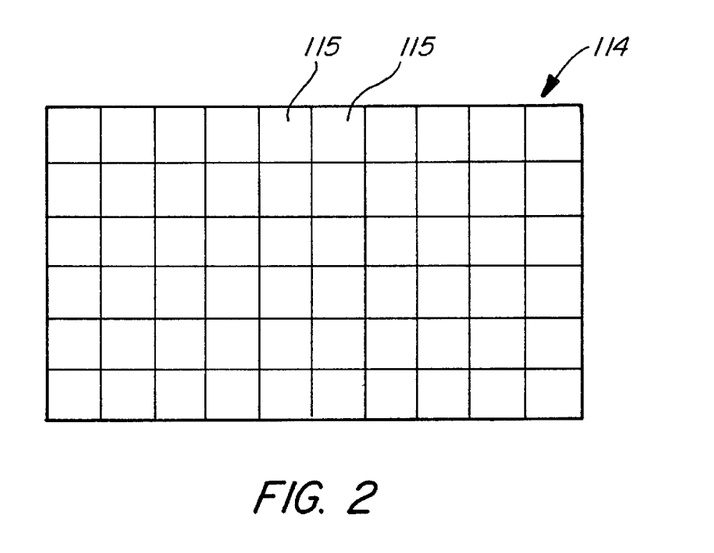
FIG. 2 schematically illustrates a reticle divided into sections.

FIG. 2 schematically illustrates a plan view of a reticle that may be used in practicing the present invention. Reticle 114 is divided into a plurality of sections 115. Each of the plurality of sections 115 may have a dimension that is relatively small compared to the variation of the expected wavefront of the projection optic. Therefore, since the wavefront is expected to vary gradually over the image field, there will be very little wavefront variance across individual sections 115. Each of the sections 115, which in practice may have a dimension in the order of approximately one millimeter or less, has formed thereon a plurality of gratings having different orientations and periods, pitches, or spatial frequencies. While the sections 115 are illustrated as being rectangular, they may be of any shape, such as circular.

Figure 3:
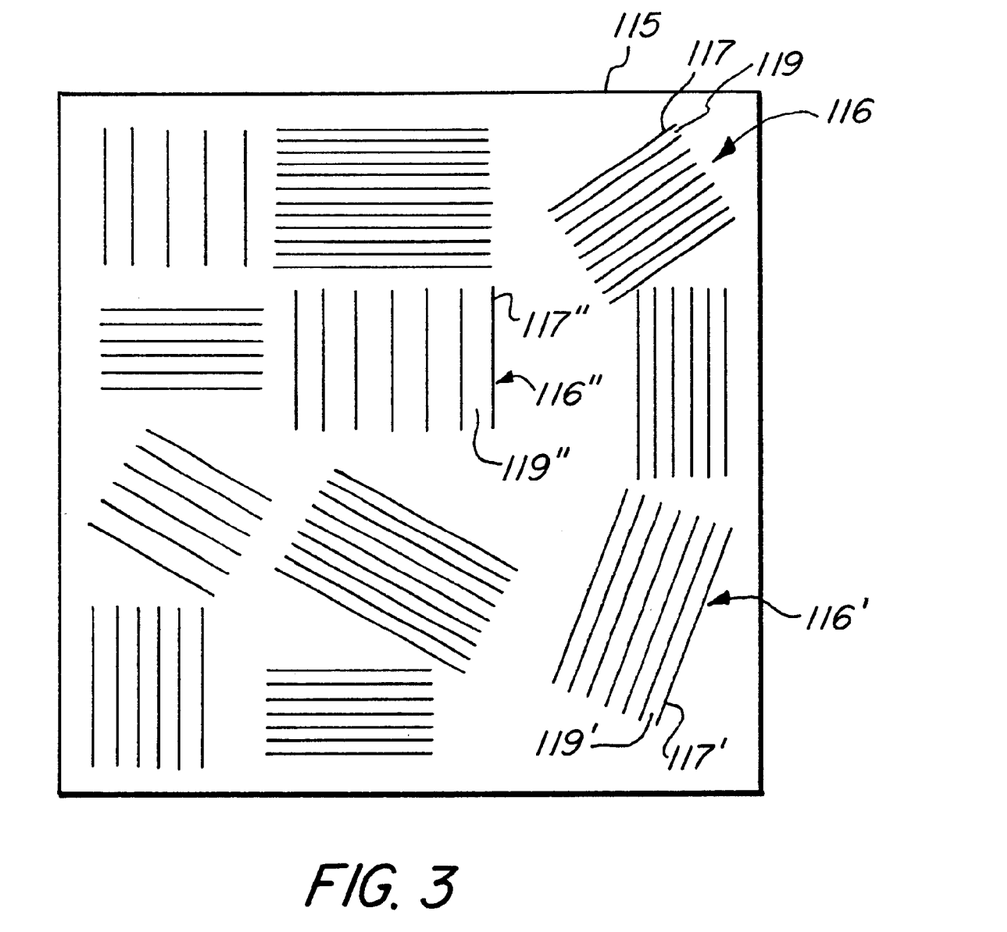
FIG. 3 illustrates a section of a reticle having a plurality of gratings thereon.

FIG. 3 illustrates an example of one section 115. Formed on sections 115 are a plurality of gratings 116, 116' and 116". Only three gratings have been numbered by way of example, but the other gratings illustrated formed on the section 115 are similar. Each of the plurality of gratings may have a different period or spatial frequency and orientation. The gratings may be composed of opaque lines 117, 117' and 117" having transparent spaces 119, 119' and 119' there between. Preferably, the opaque lines 117, 117' and 117" will have a dimension equal to the transparent spaces 119, 119' and 119". Additionally, at least five cycles of alternating lines and spaces are desirable for each grating 116, 116', and 116". The arrangement of gratings 116, 116', and 116" may take any number of formats as long as the period or spatial frequency of the gratings vary and the orientation of the gratings vary. The orientation of a grating may be defined as the angle formed by the parallel lines 117, 117', or 117" of the gratings relative to a reference axis. Period refers to the total width of a grating cycle which in turn consists of one line and one space, and spatial frequency refers to the number of lines and spaces per unit dimension. The gratings may be formed by any conventional technique for forming a grating on a substrate.

Figure 4:
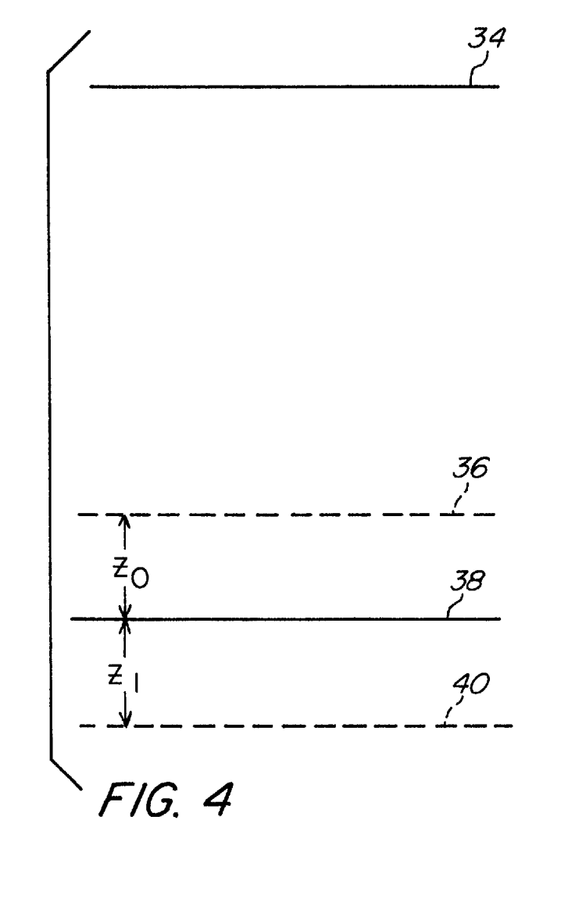
FIG. 4 schematically illustrates different planes used to project the image of a grating and detection of the image.

FIG. 4 graphically illustrates the different planes in which intensity measurements may be taken according to the present invention. A test reticle, such as illustrated in FIGS. 2 and 3 having a plurality of gratings thereon is placed within a reticle plane 34. The image of the test reticle is formed in a first detection plane 38 which is in a nominal focal plane. The term nominal focal plane is intended to mean a plane close to the focal plane of the optical system within a predetermined nominal range. The intensity of the image of the grating in the first detection plane 38 or nominal focal plane is detected and measured. The illumination intensity formed by the reticle is also detected and measured in another second detection plane 36 a predetermined distance $z_0$ from the first detection plane 38. Another intensity measurement is obtained in a third detection plane 40 a predetermined distance $z_1$ from the first detection plane 38. Accordingly, the image of each grating is detected and measured in three different planes substantially perpendicular to the optical axis of the projection optic.

Figure 5A:
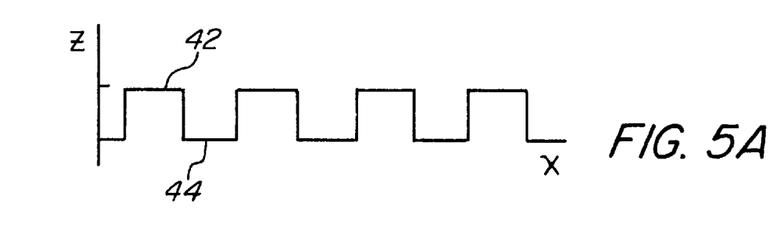
FIGS. 5A–D graphically depict a grating and the resulting image intensity in the different planes illustrated in FIG. 4.
Figures 5B, 5C, 5D:
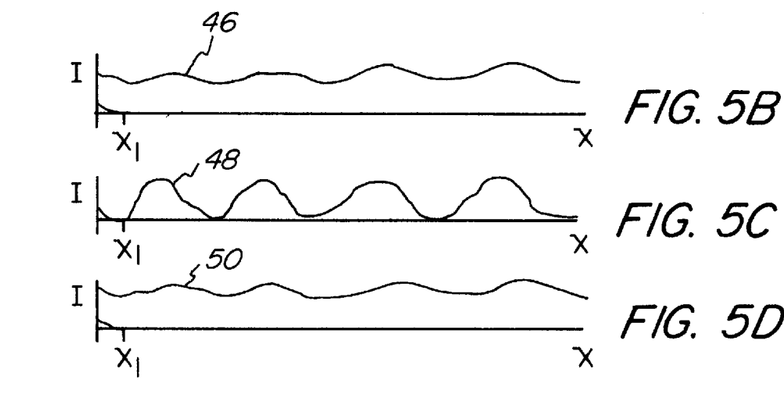

FIGS. 5A–5D graphically illustrate a grating and the resulting illumination intensity signals obtained therefrom. FIG. 5A graphically illustrates a grating. The grating has transparent portions of high transmittance 42 and opaque portions having very little or no transmittance 44. For example, FIG. 5A graphically depicts a portion of the grating 116", illustrated in FIG. 3, such that the lines 117" of the grating are parallel to a Y axes and perpendicular to the X axes. Accordingly, FIG. 5A illustrates the spatial frequency or modulation of the grating in the X direction. However, only a portion of the grating is illustrated for convenience. The grating may extend for more cycles or periods, which is not illustrated. FIG. 5C represents the intensity signal of an image of the grating, illustrated in FIG. 5A, at the nominal focal plane, the first detection plane 38 illustrated in FIG. 4. The intensity as a function of distance X is represented by wave form 48, which is substantially sinusoidal. Additionally, wave form 48 may have a phase shift represented by distance $X_1$. The phase shift of the wave form 48 from an expected position with reference to the position of the grating is due to aberrations in the projection optic which typically result in wavefront changes which are to be detected. FIG. 5B represents the image intensity of the grating in a second detection plane 36, illustrated in FIG. 4, displaced a distance $Z_0$ from the first detection plane 38, also illustrated in FIG. 4. Waveform 46 illustrates the detected intensity as a function of distance in the X direction. Wave form 46 is sinusoidal and may also have a phase shift. The location of plane 36, that is spaced a distance $z_0$ away from plane 38 is selected so that the nominal modulation of the grating fundamental frequency is either significantly reduced with respect to the modulation measured in plane 38 or a minimum. Wavefront aberrations will change the nominal modulation. Similarly, FIG. 5D illustrates the illumination intensity of the grating image at a distance $Z_1$ displaced from the first detection plane 38, illustrated in FIG. 4. Waveform 50 represents the illumination intensity of the image of the grating. Waveform 50 may also have a phase shift. The location of plane 40, that is the distance $z_1$ is selected by a criterion that is similar to that used to select plane 36. The distances $z_0$ and $z_1$ must be different. Wavefront aberrations will change the nominal modulation. Accordingly, wavefront information can be computed from the image intensity detected as a function of distance in at least two detection planes. However, measurements taken in at least three detection planes are preferred, and sometimes required to obtain the necessary accuracy. By performing calculations based upon intensity information obtained from the several detection planes 36, 38, and 40 for a variety of gratings having different periods and orientations, wavefront information may be mapped for the projection optic. As a result, any changes or deviations from expected values may be quickly detected without the need for removing the projection optic, eliminating the need to interrupt production. Additionally, the required measurements may be made in near real time making better and more timely process control possible, potentially avoiding costly imaging problems that previously would likely only be discovered during subsequent processing.

Figure 6:
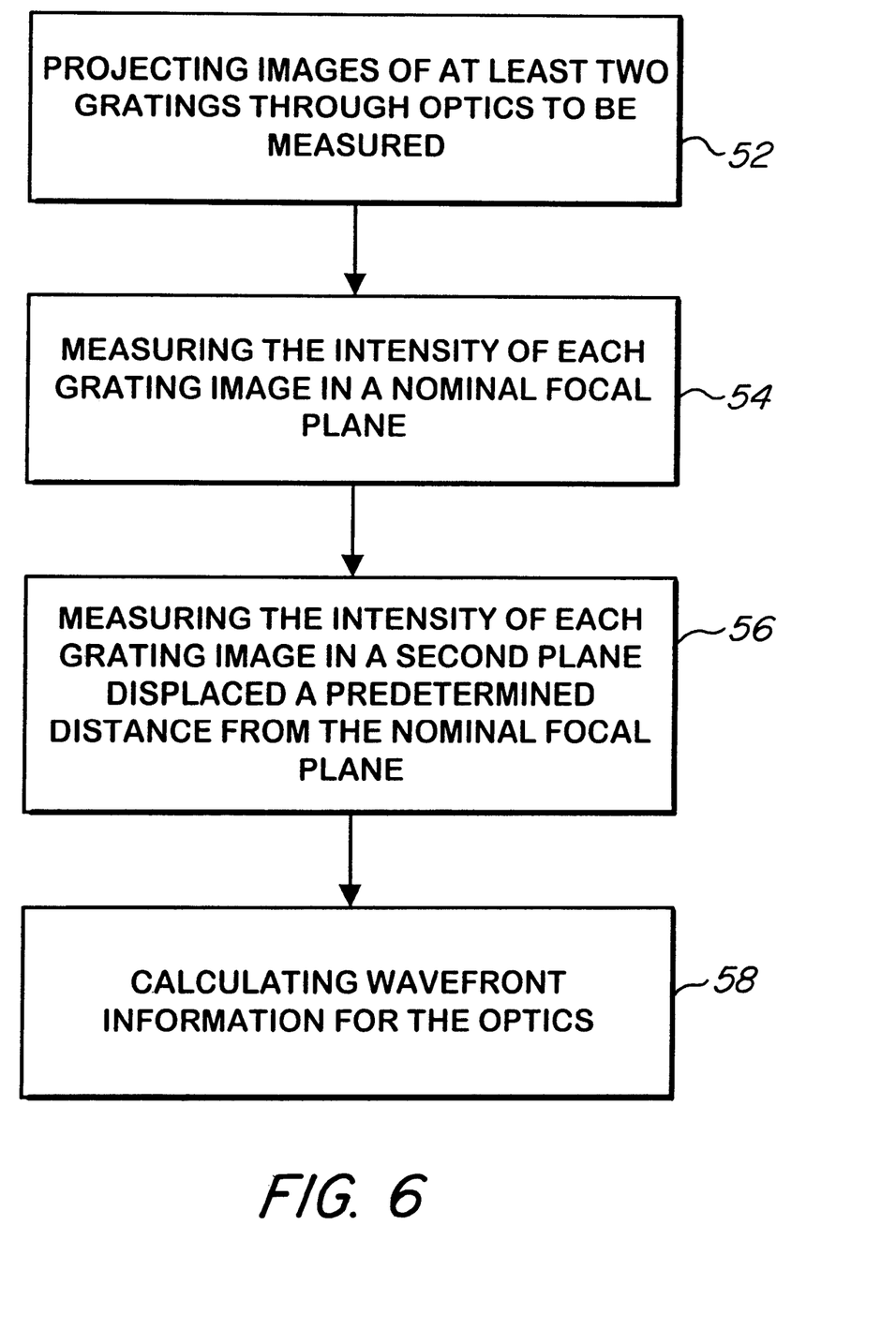
FIG. 6 is a block diagram illustrating different acts or steps in performing the present invention.

FIG. 6 is a block diagram illustrating the acts or method steps used in practicing the present invention. Block 52 represents the step of projecting images of at least two gratings through optics to be measured. Block 54 represents the step of measuring the intensity of each grating image in a nominal focal plane. Block 56 represents the step of measuring the intensity of each grating image in a second plane displaced a predetermined distance from the nominal focal plane. Block 58 represents the step of calculating wavefront information for the optics based on the image information obtained in the nominal focal plane and the second plane. The above method steps make practical the measurement of wavefront information for an optical system used in a photolithographic device. These method steps can be practiced utilizing existing portions of photolithographic devices, such as reticle and wafer staging with their relatively high degree of positional accuracy. In practice one will probably use more than two grating periods with several orientations for each grating period and record the image in at least three planes.

Figures 7, 7A:
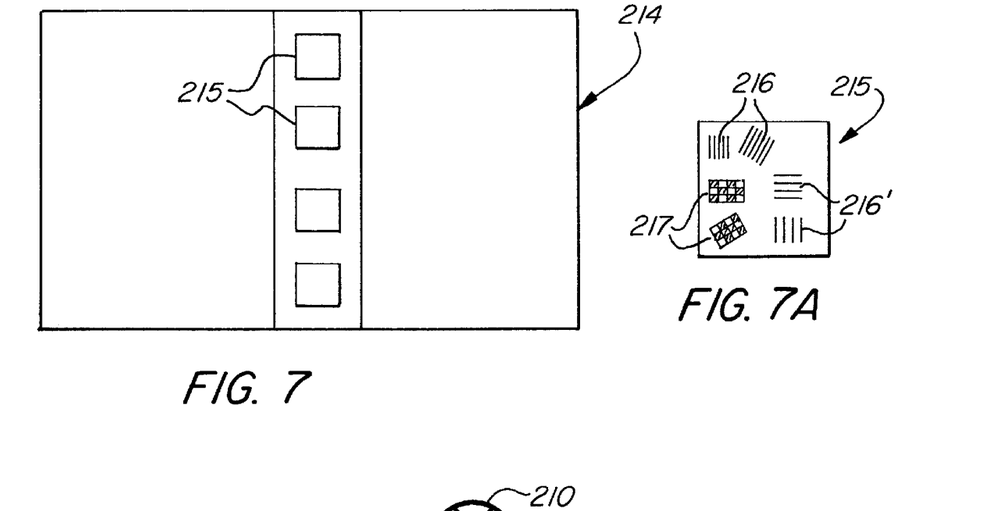
FIG. 7 is a plan schematic view of a reticle that may be used in a scanning type photolithographic device.
FIG. 7A is an enlarged plan schematic view of a section illustrated in FIG. 7.

FIG. 7 illustrates a slot reticle 214 specifically adapted to be used with a step and scan photolithographic device. Within or on the slot reticle 214 are a plurality of sections 215. For example, the plurality of sections may be positioned along a single dimension or a width of the reticle 214. Each of the plurality of sections 215 has a plurality of gratings. FIG. 7A illustrates and enlarged view of one of the plurality of sections 215. The gratings 216 and 216' have different pitches and orientations. Additionally, other gratings may be utilized, such as two dimensional gratings or checkerboard gratings 217, as well as other quasi periodic patterns with varying period, gray scale transmittance, complex amplitude transmittance that is both intensity and phase modulated, or high spatial frequency half tone or other modulation. In practice, the desired set of wavefront-sampling grating periods and orientations should be placed on the reticle so that reticle stage displacements can place them within a region of the image field that is small enough so that the wavefront does not vary significantly over the region. The set should also be printed on other regions of the reticle corresponding to other image areas where the wavefront may be expected to vary significantly. Thus, for any single image area the gratings can, but need not be positioned within the instantaneous slot of a step and scan photolithographic system. Therefore, the present invention may be applied to a step and scan photolithographic system where a reticle is projected onto a substrate by scanning in synchronization with well corrected optics having a rectangular slot field size smaller than the image of the reticle being produced. Obviously, the technique can be applied to other lithographic tools including step and repeat photolithographic tools. For non step and scan lithographic tools the set of gratings must be located within an area corresponding to a region of approximately constant wavefront.

Figure 8:
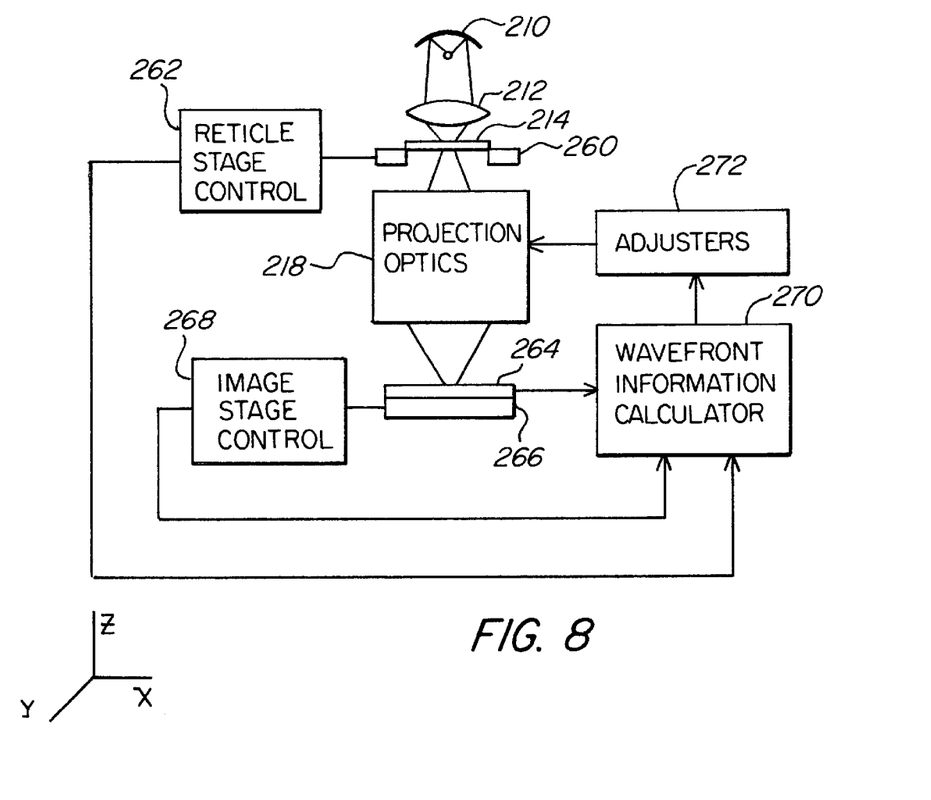
FIG. 8 schematically illustrates the present invention in a scanning type photolithographic device.

FIG. 8 schematically illustrates the present invention applied to a step and scan photolithographic device or tool which may be used in semiconductor manufacturing. An illumination source 210, which may be an extended source derived from for example either a lamp or a laser, is projected onto the slot reticle 214 by illumination optics 212. The slot reticle 214 is positioned on a reticle stage 260, which is controlled by a reticle stage control 262 such that after positioning of the reticle 214, the position of the reticle, and therefore the gratings formed thereon is known to a relatively high degree of precision. Projections optic 218 projects the image of the reticle 214 onto a detector 264. The detector 264 may be any suitable detector that accurately measures the illumination intensity of the image of the plurality of gratings formed on the reticle 214. The detector 264 may digitally sample the image as long as the required image information is obtained. The detector 264 is attached to an image stage 266 on which in normal production a wafer or other photosensitive substrate is positioned for use in the manufacture of semiconductor or electronic devices. However, other types of detectors may be used. For example, a detector may be used to indirectly view the image of the gratings to obtain the required data. The image need not be formed on the detector directly. The image stage 266 is controlled by image stage control 268. The image stage control 268, in combination with the image stage 266, is capable of moving in the X, Y and Z direction. The precise location of the image stage 266 is known through the use of conventional interferometer type stage techniques. The detector 264 is coupled to and provides data to wavefront information calculator 270. The wavefront information calculator 270 calculates wavefront information from the data obtained by the detector 264 and may, if desired, provide this information to an adjuster 272 which may use the wavefront information from wavefront information calculator 270 to make a suitable adjustment to the projection optic 218. Such adjustments may be performed by introducing additional optical elements, removing optical elements, introducing stress and resulting strain on different optical elements, for example, deforming a mirror which may form a part of the projection optic in a known way to modify a wavefront, and therefore, maintain or improve the image and characteristics of the projection optic.

The present invention, by detecting the image intensity of a plurality of gratings having different periods and orientations and measured in at least two different planes, provides the information required to calculate useful wavefront information for monitoring the performance of an optical system.

The operation of the present invention can more fully be appreciated by considering the following. For a specific position in the image field, one grating can give the value of the wavefront relative to the center of the pupil of the projection optic at two points in the projection optic pupil located at the same radius value on opposite sides of a diameter perpendicular to the lines of the grating. Accordingly, the entire wavefront can be computed from measurements taken at different field positions for gratings having different periods and orientations. The dominant diffraction, diffraction orders −1, 0, and +1, from the grating travel through the optical system at three pupil points sampling the wavefront. A grating having equal line and space widths has no even harmonics, excluding the zero order. When the grating period is small enough, nominally less than ⅓ of the wavelength divided by the numerical aperture only the three diffraction orders −1, 0, and +1 can form intensity images with the same period as the grating. Diffraction orders greater than the second are not transmitted by the projection optic. Normally the outer part of the wavefront is considered most critical and such gratings are adequate to characterize this part of the wavefront of a projection optic. If desired the central part of the wavefront can be characterized with gratings with larger periods. The effect of the higher harmonics can be accounted for by the use of information derived from smaller period gratings or by the use of modulated or halftoned gratings. A one dimensional grating can be approximated with a square area containing five or more cycles or periods. By detecting the grating image intensity as a function of departure from a nominal focal plane, Z, and the distance measured along a line perpendicular to the grating lines, x, wavefront information may be computed or calculated. It is convenient to let x=0 in the center of the grating reticle pattern corresponding to the image center for a perfect wavefront. Using the image data, spatially filtered, to retain only the grating fundamental period, P, the spatially filtered image may be expressed in the following form, equation one:

$$I(\alpha, \rho, z) = \cos\left[2\pi\left\{\frac{x}{P} + w(\alpha)_{odd}\right\}\right] \times$$
$$\cos\left[2\pi\left\{w(\alpha)_{even} - w(0) + \frac{z}{\lambda}\left(\sqrt{1-\alpha^2} - 1\right)\right\}\right]$$

where, $$\alpha = \frac{\lambda}{P}$$

and,

λ is the wavelength of the light,
P is the grating period,
x is the distance measured along a line perpendicular to the grating lines, and
Z is the distance from the nominal focal plane.

$w(\alpha)_{odd}$ and $\{[w(\alpha)_{even}-w(0)\}$ are the odd and even parts of the wavefront respectively, evaluated at the pupil numerical aperture values of ±α in the x-direction and expressed in units of waves. Since the wavefront is always measured with respect to a reference value, and here the reference value is the pupil center, x=0, it is convenient and without any loss of generality, to let the reference value be 0, w(0)=0. In equation one, the argument of the first factor contains the fundamental period of the grating shifted in position by the odd part of the wavefront aberration. The second factor is the magnitude or modulation of the fundamental period as a function of the departure from the nominal focal plane and even part of the wavefront aberration.

Each grating image must be measured as a function of X and Z, with Z being the axis in the direction of the optical axes or focus direction and X being an axes perpendicular thereto. While only two values of Z are required, it is preferable and convenient to measure the aerial image of the grating as a function of X for three different values of Z. As illustrated in FIG. 4, the values of Z for the planes in which measurements are taken include the nominal image plane, Z approximately 0, and two values of Z on each side of the nominal focal or image plane where the image modulation is near zero, or has a relatively low intensity. However, other planes may be of value, including low modulation planes quite far from the image plane. As is clear from an inspection of equation one, the wavefront may be calculated or computed from the grating image information obtained as a function of x for at least two values of Z. However, it is desirable to obtain image information from three predetermined values of Z, since the absolute grating image intensity is probably unknown to the require accuracy to allow the wavefront computation with measurements recorded at only two values of Z.

The measured image data may be filtered to select the fundamental frequency and appropriately fitted to the theoretically expected image, indicated by equation one, to minimize the effect of measurement error on the wavefront estimate. This gives an estimate of the change in the position of the center of the filtered image, from x=0 to x=x̂ and an estimate of the shift from nominal focus, from Z=0 to Z=ẑ. Where the carrot (^) donates the estimated value of the underlying variable derived from the measured data. An estimate of the odd part of the wavefront is:

$$(\hat{w}(\alpha))_{odd} = -\frac{\alpha \hat{x}}{\lambda}$$

and an estimate of the even part of the wavefront is:

$$(\hat{w}(\alpha))_{even} = -\frac{\hat{z}}{\lambda}\left(\sqrt{1-\alpha^2} - 1\right)$$

Thus, an estimate of the wavefront at the pupil numerical aperture values of ±α in the x direction and expressed in units of waves is:

$$\hat{w}(\alpha) = \hat{w}(\alpha)_{even} + \hat{w}(\alpha)_{odd}$$

$$\hat{w}(-\alpha) = \hat{w}(\alpha)_{even} - \hat{w}(\alpha)_{odd}$$

The error in the wavefront estimate is a function of the number of wavefront samples and errors in estimating the intermediate perimeters x̂ and ẑ resulting from fitting the measured data to the expected image, determined from equation one. A precision wafer stage may be required to collect appropriately accurate image data, since the location of the grating and the resulting image, must be precisely known. Such stages are known and currently available on photolithographic production tools or devices.

The aerial image of the grating may be detected by any known detector. For example, the aerial image of the grating may be detected and recorded by scanning the aerial image with a narrow slit. The slit should emphasize the grating frequency. This requirement is satisfied if the slit width is less than P/2. Other useable aerial image scanning geometries may be used, including other slit widths, gratings and edges. Other suitable methods, including photolithography, may be utilized to detect and record the aerial image of the gratings to obtain the required data for calculating the wavefront.

While equation one is specific to a point illumination source, a similar equation may be derived and then utilized for an extended illumination source. The measured image data may be filtered to select the fundamental frequency and appropriately fitted to the extended source illumination theoretically expected image to minimize the effect of measurement error on the wavefront estimate.

As before, the phase and modulation of the fundamental grating period is computed from aerial image measurements. This process is repeated for a number of grating periods and orientations in at least two, but preferably three planes. Typically one plane is the nominal image plane and the others the nominal planes, on either side of the image and closest to the image plane, where the expected modulation is either significantly lower or a minimum.

For the extended illumination source, it may be convenient to write the wavefront as a weighted-sum of orthonormal polynomials including for example, the conventional normalized Zernike polynomials. Then by a least-square, other statistical, or algebraic means one can calculate the set of polynomial coefficient weights that represent the wavefront aberrations.

A typical configuration might be a source coherence of ⅓ of the projection optic numerical aperture and a wave front that could be represented by the first ten nontrivial Zernike polynomials. At each field point, a useful set of gratings is three or four grating pitches each replicated in four orientations at multiples of forty-five degrees for a total of twelve or sixteen gratings. For three grating periods, three grating periods, three useful grating periods are: $P_0$, $(\frac{2}{3})P_0$, and $(\frac{1}{3})P_0$, where $P_0 = \lambda/$numerical aperture.

The above has been made clearer, with no loss of generality, by considering optical systems with the following restrictions; unobscured pupil, telecentric at both the object and image planes, well behaved small wavefront aberration, that is aberrations much less than one wavelength maximum, that vary slowly as a function of field position, and illumination with a single wavelength, a single polarization state, and of high spatial coherence.

In general, the extent of the illumination spatial coherence, as observed in the pupil, should be of the order of or smaller than satisfy the lesser of, the desired wavefront sample area.

The teachings of the present invention make possible determination of wavefront information, which is directly related to system performance, with little, if any, disruption to the manufacturing process and without the need of removing or disturbing the projection optics of a photolithographic system used in the manufacture of semiconductor devices. The required measurements can be obtained utilizing current reticle and wafer stages of existing photolithographic equipment with little or no modification. The test reticle forming part of the invention may be fabricated relatively easily using conventional techniques. Accordingly, the present invention is a relatively low-cost and convenient apparatus and method for determining wavefront information. The present invention can be utilized frequently to avoid costly downtime and makes possible detection of a degradation in the projection optics with resulting changes in image quality before it can affect product quality. Additionally, the present invention may be utilized with an adjuster that is associated with the projection optic to provide some adjustment or modification to compensate for any wavefront aberrations or errors detected for extending the operation of the photolithographic device before requiring extensive maintenance or service, while at the same time providing better and more consistent image quality and therefore resulting products, with less defects and higher yields.

Although the preferred embodiments have been illustrated and described, it will be obvious to those skilled in the art that various modifications may be made without departing from the spirit and scope of this invention.

What is claimed is:

1. An apparatus for measuring a wavefront of an optical system comprising:
   a reticle stage having a known first location;
   a reticle, placed on said reticle stage, said reticle having a plurality of gratings with different periods and orientations placed thereon;
   an optical system positioned to receive electromagnetic radiation passing through said reticle, said optical system having an optical axis and a nominal focus;
   an image stage having a known second location positioned to receive electromagnetic radiation passing through said optical system, said image stage movable in a direction substantially perpendicular to the optical axis and capable of moving a predetermined distance away from the nominal focus, whereby an image of the plurality of gratings with different periods and orientations is formed;
   a detector, for detecting the image of each of the plurality of gratings with different periods and orientations in at least two different planes; and
   a calculator coupled to said detector and said reticle and image stages, said calculator calculating wavefront information.

2. An apparatus for measuring a wavefront of an optical system as in claim 1 wherein:
   each of said plurality of gratings have equally spaced opaque and transparent portions.

3. An apparatus for measuring a wavefront of an optical system as in claim 1 wherein:
   each of said plurality of gratings has at least five cycles.

4. An apparatus for measuring a wavefront of an optical system as in claim 1 wherein:
   said plurality of gratings are arranged forming a plurality of sections.

5. An apparatus for measuring a wavefront of an optical system as in claim 4 wherein:
   each of said plurality of sections has a dimension less than a spatial variance of the wavefront.

6. An apparatus for measuring a wavefront of an optical system as in claim 5 wherein:
   each of said plurality of sections has a dimension less than one millimeter.

7. An apparatus for measuring a wavefront of an optical system as in claim 5 wherein:
   the gratings in any single section can be placed within a square of side one millimeter by reticle stage travel.

8. An apparatus for measuring a wavefront of an optical system as in claim 1 further comprising:
   a point illumination source.

9. An apparatus for measuring a wavefront of an optical system as in claim 1 further comprising:
   an extended illumination source.

10. An apparatus for measuring a wavefront of an optical system as in claim 1 wherein:
    said calculator calculates the wavefront information based upon the following equation, $$I(\alpha, \rho, z) = \cos\left[2\pi\left\{\frac{x}{P} + w(\alpha)_{odd}\right\}\right] \times$$
$$\cos\left[2\pi\left\{w(\alpha)_{even} - w(0) + \frac{z}{\lambda}\left(\sqrt{1-\alpha^2} - 1\right)\right\}\right]$$

where, $$\alpha = \frac{\lambda}{P}$$

and,
   $\lambda$ is the wavelength of the light,
   P is the grating period,
   x is the distance measured along a line perpendicular to the grating lines, and
   Z is the distance from the nominal focal plane.

11. An apparatus for measuring a wavefront of an optical system as in claim 10 wherein:
    said calculator calculates the wavefront information based upon the equation and its extension to the image of a fundamental frequency of a grating illuminated with an extended illumination source.

12. An apparatus for obtaining wavefront information for an optical system in a photolithographic device comprising:
- a reticle having a plurality of gratings with different periods and orientations formed thereon;
- a reticle stage positioning said reticle at a first location;
- an image stage, said image stage capable of moving a predetermined distance out of a nominal focal plane of the optical system and being positioned at a second location;
- an illumination source projecting an image of each of said plurality of gratings through the optical system;
- an image intensity detector detecting the intensity of the image of each of the plurality of gratings in the nominal focal plane and at a predetermined distance out of the nominal focal plane; and
- a wavefront information calculator, coupled to said image intensity detector and said reticle and image stages, said wavefront information calculator calculating wavefront information based on the first location of said reticle stage, the second location of said image stage, and the image intensity detected in at least the nominal focal plane and the predetermined distance out of the nominal focal plane,
- whereby wavefront information is calculated and changes in a performance of the optical system can be detected.

13. An apparatus for obtaining wavefront information for an optical system in a photolithographic device as in claim 12 wherein:
- each of said plurality of gratings have equally spaced opaque and transparent portions.

14. An apparatus for obtaining wavefront information for an optical system in a photolithographic device as in claim 12 wherein:
- said plurality of gratings are arranged forming a plurality of sections.

15. An apparatus for obtaining wavefront information for an optical system in a photolithography device as in claim 14 wherein:
- each of said plurality of sections has a dimension less than the spatial variance of the wavefront.

16. An apparatus for obtaining wavefront information for an optical system in a photolithography device as in claim 14 wherein:
- each of said plurality of sections has a dimension less than one millimeter.

17. An apparatus for obtaining wavefront information for an optical system in a photolithographic device as in claim 14 wherein:
- the gratings in any single section can be placed within a square of side one millimeter by reticle stage travel.

18. An apparatus for obtaining wavefront information for an optical system in a photolithographic device as in claim 12 further comprising:
- an adjuster, said adjuster coupled to said wavefront information calculator and the projection optics, and capable of adjusting the optical system modifying the wavefront.

19. An apparatus for obtaining wavefront information for an optical system in a photolithographic device as in claim 12 wherein:
- said wavefront information calculator calculates the wavefront information based upon the following equation, $$I(\alpha, p, z) = \cos\left[2\pi\left\{\frac{x}{P} + w(\alpha)_{odd}\right\}\right] \times$$
$$\cos\left[2\pi\left\{w(\alpha)_{even} - w(0) + \frac{z}{\lambda}\left(\sqrt{1-\alpha^2} - 1\right)\right\}\right]$$

where, $$\alpha = \frac{\lambda}{P}$$

and,
- $\lambda$ is the wavelength of the light,
- P is the grating period,
- x is the distance measured along a line perpendicular to the grating lines, and
- Z is the distance from the nominal focal plane.

20. An apparatus for obtaining wavefront information for an optical system in a photolithographic device as in claim 19 wherein:
- said calculator calculates the wavefront information based upon the equation and its extension to the image of a fundamental frequency of a grating illuminated with an extended illumination source.

21. An apparatus for measuring a wavefront of an optical system for use in a photolithographic device comprising:
- a plurality of gratings with different periods and orientations, each of said plurality of gratings having a first location;
- an optical system positioned to receive electromagnetic radiation passing through said reticle, said optical system having an optical axis and a nominal focus;
- image means for receiving an image of each of said plurality of gratings projected through said optical system, and capable of moving a predetermined distance away from the nominal focus along the optical axis, whereby an image of the plurality of gratings is formed at a second location displaced relative to the optical axis from the first location;
- detector means, associated with said image means, for detecting the image of each of said plurality of gratings at the nominal focus and the predetermined distance away from the nominal focus; and
- calculator means, coupled to said detector means, for calculating wavefront information based upon image intensity of the image of each of said plurality of gratings at the nominal focus and the predetermined distance away from the nominal focus and any displacement relative to the optical axis between the first location of each of the plurality of gratings and the second location of the image of the plurality of gratings,
- whereby changes in wavefront can be detected providing information relating to image quality.

22. An apparatus for measuring a wavefront of an optical system for use in a photolithographic device as in claim 21 wherein:
- said calculator means calculates the wavefront information based upon the following equation, $$I(\alpha, p, z) = \cos\left[2\pi\left\{\frac{x}{P} + w(\alpha)_{odd}\right\}\right] \times$$

$$\cos\left[2\pi\left\{w(\alpha)_{even} - w(0) + \frac{z}{\lambda}\left(\sqrt{1-\alpha^2} - 1\right)\right\}\right]$$

where, $$\alpha = \frac{\lambda}{P}$$

and, $\lambda$ is the wavelength of the light,

P is the grating period, x is the distance measured along a line perpendicular to the grating lines, and Z is the distance from the nominal focal plane.

23. An apparatus for measuring a wavefront of an optical system for use in a photolithographic device as in claim 22 wherein:

said calculator calculates the wavefront information based upon the equation and its extension to the image of a fundamental frequency of a grating illuminated with an extended illumination source.

24. A method of determining wavefront information for an optical system comprising the steps of:

locating a reticle having a plurality of gratings thereon with different periods and orientations such that each of the plurality of gratings has a known location;

forming an image of each of the plurality of gratings with the optical system;

detecting the image of each of the plurality of gratings in a nominal focal plane and a first plane a predetermined distance from the nominal focal plane, each image having an illumination intensity;

determining the location of the image of each of the plurality of gratings relative to the known location of each of the plurality of gratings; and calculating wavefront information based upon the location of the image of each of the plurality of gratings relative to the known location of each of the plurality of gratings, and the illumination intensity, whereby wavefront information is obtained providing an indication of any change in the optical system.

25. A method of determining wavefront information for an optical system as in claim 24 wherein:

said step of calculating wavefront information calculates the wavefront information based upon the following equation, $$I(\alpha, \rho, z) = \cos\left[2\pi\left\{\frac{x}{P} + w(\alpha)_{odd}\right\}\right] \times$$
$$\cos\left[2\pi\left\{w(\alpha)_{even} - w(0) + \frac{z}{\lambda}\left(\sqrt{1-\alpha^2} - 1\right)\right\}\right]$$

where, $$\alpha = \frac{\lambda}{P}$$

and, $\lambda$ is the wavelength of the light,

P is the grating period, x is the distance measured along a line perpendicular to the grating lines, and Z is the distance from the nominal focal plane.

26. A method of determining wavefront information for an optical system as in claim 25 wherein:

said step of calculating wavefront information calculates the wavefront information based upon the equation and its extension to the image of a fundamental frequency of a grating illuminated with an extended illumination source.

* * * * *